(12) United States Patent
Dalena et al.

(10) Patent No.: US 9,431,904 B2
(45) Date of Patent: Aug. 30, 2016

(54) DC/DC CONVERTER EFFICIENCY IMPROVEMENT FOR LOW CURRENT LEVELS

(71) Applicant: Dialog Semiconductor GmbH, Kirchheim/Teck-Nabern (DE)

(72) Inventors: Francesco Dalena, Livorno (IT); Enrico Pardi, Cascina (IT); Stefano Scaldaferri, Bientina (IT)

(73) Assignee: Dialog Semiconductor (UK) Limited, London (GB)

( * ) Notice: Subject to any disclaimer, the term of this patent is extended or adjusted under 35 U.S.C. 154(b) by 18 days.

(21) Appl. No.: 14/445,300

(22) Filed: Jul. 29, 2014

(65) Prior Publication Data

US 2015/0194890 A1 Jul. 9, 2015

(30) Foreign Application Priority Data

Jan. 9, 2014 (EP) .................................... 14150665

(51) Int. Cl.
*H02M 3/158* (2006.01)
*H02M 1/088* (2006.01)
(Continued)

(52) U.S. Cl.
CPC ............. *H02M 3/158* (2013.01); *H02M 1/088* (2013.01); *H02M 3/1588* (2013.01); *H03K 17/122* (2013.01); *H02M 2001/0032* (2013.01);
(Continued)

(58) Field of Classification Search
CPC .................. H02M 2001/0045; H02M 3/1584; H02M 3/1588; H02M 7/49; H02M 7/493; G05F 1/56; G05F 1/59
USPC ................... 323/268, 269, 271, 272; 363/71
See application file for complete search history.

(56) References Cited

U.S. PATENT DOCUMENTS 5,414,341 A * 5/1995 Brown ................. G05F 1/563
323/259
5,673,187 A * 9/1997 Tokunaga ......... H02M 3/33569
323/268

(Continued)

FOREIGN PATENT DOCUMENTS

EP      1 524 567       4/2005

OTHER PUBLICATIONS

European Search Report 14150665.9-1809, Dialog Semiconductor GmbH, Mailed: Jun. 25, 2014.

(Continued)

*Primary Examiner* — Adolf Berhane
(74) *Attorney, Agent, or Firm* — Saile Ackerman LLC; Stephen B. Ackerman

(57) ABSTRACT

The present document relates to efficient DC/DC converters with a modular structure for providing different levels of output currents. A controller for controlling a power converter which is configured to convert electrical power at an input voltage into electrical power at an output voltage is described. The power converter comprises first and second inverter stages comprising high side switches and low side switches which are arranged in series between the input voltage and a reference voltage. The midpoints between the high side switches and the low side switches are coupled. The electrical power at the output voltage is drawn from the midpoint. The controller is configured to determine an indication of a requested level of the electrical power at the output voltage, and to activate or deactivate the second inverter stage based on the indication of the requested level of the electrical power at the output voltage.

24 Claims, 6 Drawing Sheets

(51) Int. Cl.
  *H03K 17/12* (2006.01)
  *H02M 1/00* (2006.01)
(52) U.S. Cl.
  CPC ............... *H02M2001/0048* (2013.01); *H02M 2001/0054* (2013.01); *Y02B 70/1466* (2013.01); *Y02B 70/1491* (2013.01); *Y02B 70/16* (2013.01)

(56) References Cited

U.S. PATENT DOCUMENTS

| | | | | |
|---|---|---|---|---|
| 6,144,194 A * | 11/2000 | Varga | .................. | H02M 1/44 323/269 |
| 6,380,721 B2 * | 4/2002 | Pattamatta | ............... | G05F 1/40 323/269 |
| 6,424,128 B1 * | 7/2002 | Hiraki | ..................... | G06F 1/26 323/268 |
| 7,138,788 B2 * | 11/2006 | Rice | ................... | H02M 3/1584 323/268 |
| 7,301,313 B1 * | 11/2007 | Hart | ....................... | G06F 1/263 307/74 |
| 8,624,567 B2 * | 1/2014 | Popescu | ............. | H02M 3/1584 323/267 |
| 9,000,741 B2 * | 4/2015 | Huang | .................. | G05F 1/468 323/268 |
| 2011/0264933 A1 | 10/2011 | Forsythe | | |
| 2013/0038316 A1 | 2/2013 | Ouyang | | |
| 2013/0176015 A1 | 7/2013 | Sato et al. | | |

OTHER PUBLICATIONS

Co-pending U.S. Appl. No. 14/445,288, filed Jul. 29, 2014, "High Voltage DC/DC Converter with Master/Slave Output Stage," by Francesco Dalena, et al., 30 pgs.

* cited by examiner

DC/DC CONVERTER EFFICIENCY IMPROVEMENT FOR LOW CURRENT LEVELS

RELATED PATENT APPLICATION

This application is related to Ser. No. 14/445,288, filed on Jul. 29, 2014, which is herein incorporated by reference in its entirety and is assigned to a common assignee, and which is being filed on the same date as the instant application.

TECHNICAL FIELD

The present document relates to DC (Direct Current)/DC converters. In particular, the present document relates to efficient DC/DC converters with a modular structure for providing different maximum levels of output currents.

BACKGROUND

DC/DC power converters may be used for converting electrical power at an input voltage to electrical power at an output voltage, wherein the input voltage and the output voltage are different. The input voltage may e.g. be in the range of 15V which is typically referred to as a high voltage application.

In DC/DC converters, a plurality of inverter stages of power converters may be arranged in parallel, in order to adapt the power converter to different maximum output currents, i.e. to different maximum loads. The inverter stages which are arranged in parallel may be referred to as "slices". The different slices may be equal with respect to one another. This is beneficial in view of the design of the power converter so as to make the power converter easily adaptable and configurable. On the other hand, the drawback of using a plurality of parallel slices is that the replicas of inverter stages dissipate current, thereby reducing the total efficiency of the power converter. In particular, the drawback of such parallel structures is that for relatively low levels of output current the efficiency of the overall converter reduces, due to the contribution of switching losses of the plurality of inverter stages.

SUMMARY

The present document addresses the technical problem of providing a configurable and adaptable power converter with increased power efficiency, notably at relatively low levels of output current compared to the maximum level of output current that the power converter is designed for. In the present document a power converter Do configured to convert electrical power at an input voltage (at an input of the power converter) into electrical power at an output voltage (at an output of the power converter) is described. The input voltage and the output voltage may be DC voltages, and the power converter may be or may comprise a DC/DC power converter.

The power converter may comprise a plurality of inverter stages, wherein the plurality of inverter stages may be arranged in parallel with respect to one another. The number of inverter stages may be increased in order to increase a maximum amount or level of electrical power which may be provided at the output of the power converter. In other words, the power converter may comprise a pre-determined number of inverter stages and the pre-determined number may depend on a maximum amount or maximum level of electrical power, which is to be provided at the output of the power converter. By way of example, each inverter stage may be configured to provide a pre-determined maximum inverter current, and a power converter comprising N inverter stages may be configured to provide N times the pre-determined maximum inverter current at the output of the power converter (e.g. N greater than one).

The power converter comprises a first inverter stage with a first half bridge. The first half bridge, i.e. the first inverter stage, comprises a first high side switch and a first low side switch which are arranged in series between the input voltage and a reference voltage (e.g. ground). The first high side switch and the first low side switch may be commutated between on-state and off-state in an alternating and mutually exclusive manner to switch a midpoint of the first half bridge (i.e. the midpoint between the first high side switch and the first low side switch) between the level of the input voltage and the level of the reference voltage. The switches may be power switches and may comprise e.g. metal oxide semiconductor transistors. In particular, the high side switch may comprise a p-type metal oxide semiconductor transistor, and/or the low side switch may comprise an n-type metal oxide semiconductor transistor.

The switches may be driven by respective drivers. The drivers may be configured to provide or to draw a gate charge for charging a gate capacitor of the switches. As a result of this, the switches may be put into the on-state (by providing the gate charge) or may be put into the off-state (my drawing the gate charge). In particular, the first inverter stage may comprise a first high side driver for providing a first drive signal for the first high side switch, subject to a high side control signal at a drive voltage level. In a similar manner, the first inverter stage may comprise a first low side driver for providing a first drive signal for the first low side switch, subject to a low side control signal.

The power converter may comprise a second inverter stage with a second half bridge comprising a second high side switch and a second low side switch which are arranged in series between the input voltage and the reference voltage (e.g. ground). The second half bridge of the second inverter stage may exhibit a structure and/or design which is equal to the structure and/or design of the first half bridge or first inverter stage. As indicated above, the switches may comprise metal oxide semiconductor transistors. In particular, the high side switch may comprise a p-type metal oxide semiconductor transistor, and/or the low side switch may comprise an n-type metal oxide semiconductor transistor.

Furthermore, the second inverter stage may comprise a second high side driver for providing a second drive signal for the second high side switch, subject to a or the high side control signal at the drive voltage level. As such, the first and the second drive signals for driving the first and second high side switches may be generated subject to the same high side control signal (if the first and second inverter stages are both activated). The second inverter stage may also comprise a second low side driver for providing a second drive signal for the second low side switch, subject to a or the low side control signal. In other words, the first and the second drive signals for driving the first and second low side switches may be generated subject to the same low side control signal (if the first and second inverter stages are both activated).

The midpoint between the first high side switch and the first low side switch (of the first inverter stage) is typically coupled with the midpoint between the second high side switch and the second low side switch (of the second inverter stage). This coupled midpoint may be used to provide the electrical power towards the output of the power converter. In particular, the electrical power at the output voltage may be drawn from the coupled midpoint. For this purpose, the power converter may further comprise a filter unit (e.g. an LC circuit) coupled to the midpoint for providing the electrical power at the output voltage.

According to an aspect, a controller for controlling the above mentioned power converter is described. The controller may be implemented as an integrated circuit (IC). The controller is configured to determine an indication of a requested level of the electrical power at the output voltage. In other words, the controller may be configured to determine an indication of the level of electrical power or of the level of output current which is to be provided at the output of the power converter. This electrical power is e.g. to be provided to one or more components of an electronic device which comprises the power converter. The one or more components may comprise a display of the electronic device, one or more sensors (e.g. GPS sensors) of the electronic device, one or more telecommunication interfaces (e.g. GSM, UMTS, LTE and/or WLAN) of the electronic device, one or more software applications running on a microprocessor of the electronic device, etc. Depending on the one or more components of the electronic device which are active, the requested level of electrical power at the output of the power converter may vary significantly.

The controller is further configured to activate or to deactivate the second inverter stage based on the indication of the requested level of the electrical power at the output voltage. In other words, the controller may be configured to adapt the number of active inverter stages based on the (indication of) electrical power which is requested at the output of the power converter. By doing this, the power dissipation of the power converter may be reduced (notably at relatively low loads). As a result of this, the power efficiency of the power converter may be increased, notably at relatively low requested levels of output power, compared to the maximum level of output power which the power converter is configured to provide.

As indicated above, the power converter may be configured to provide the electrical power at the output voltage to an electronic device comprising a plurality of components. The controller may be configured to determine which one or more of the plurality of components are active. This information may be determined by request to a microprocessor or microcontroller of the electronic device, which typically has an overview of the one or more components of the electronic device that are active.

Furthermore, the controller may be configured to determine the indication of the requested level of the electrical power, based on the one or more active components. For this purpose, the controller may be configured to access a look-up table providing a mapping between the plurality of components of the electronic device and respective levels of electrical power. In particular, the indication of the requested level of the electrical power may be provided by adding up the levels of electrical power of the active components, taken from the look-up table.

Hence, the electronic device may provide the controller of the power converter with a feedback on the requested level of electrical power, thereby enabling the controller to deactivate one or more inverter stages of the power converter and thereby reducing the power dissipation of the power converter, while at the same providing a high degree of flexibility due to the plurality of parallel inverter stages of the power converter.

Alternatively or in addition, the controller may be configured to determine an indication of a current through the first high side switch and/or through the first low side switch. For this purpose, the power converter and/or the inverter stages may comprise current sensing means, e.g. one or more current sensing resistors. In particular, the controller may be configured to determine an indication of an average current through the first high side switch and/or through the first low side switch within a commutation cycle. The current/average current through the one or more switches of the one or more active inverter stages typically provides an indication of the average output current which is provided by the power converter. As such, the controller may be configured to determine the indication of the requested level of the electrical power at the output voltage based on the indication of the current and/or the average current through the first high side switch and/or through the first low side switch.

The measured (e.g. average) current through the one or more switches of the active inverter stages may provide a more precise indication of the actually requested level of electrical power. As such, the measured current may be used to refine the selection of the number of active inverter stages.

As indicated above, the power converter may comprise a pre-determined number N of inverter stages, with N>1. The controller may be configured to determine a default number n of active inverter stages based on the indication of the requested level of the electrical power at the output voltage, e.g. with 0<n≤N. In particular, the default number n of active inverter stages may be determined based on information which is provided by a microcontroller of the electronic device and/or based on measured currents through the switches of the active inverter stages. The controller may be configured to operate the power converter with the default number n of active inverter stages, wherein the default number n of active inverter stages comprises the first inverter stage. As such, the controller may operate the power converter with the default number n of active inverter stages to provide the typically requested level of electrical power. All other inverter stages of the power converter may be deactivated. As a result of the deactivation of one or more inverter stages, the power dissipation of the power converter may be reduced.

Furthermore, the controller may be configured to determine a peak of the requested level of the electrical power at the output voltage. Such peaks may occur e.g. upon activation of an additional component of the electronic device and/or subject to an increased activity of one or more components of the electronic device. The controller may be configured to determine such a peak of the request level of the electrical power or such a peak output current within a few commutation cycles.

Furthermore, the controller may be configured to operate the power converter with more than the default number n of active inverter stages, subject to determining a peak of the requested level of the electrical power at the output voltage. As a result of this, the power converter is configured to provide additional output current (i.e. additional electrical power at the output voltage) using the one or more additional inverter stages. Hence, the power converter is configured to react rapidly to peak loads.

In particular, the controller may be configured to determine an indication of a peak current through the first high side switch and/or through the first low side switch of the first inverter stage. The peak current may be measured using current sensing means. The peak current may correspond to the highest current through the first high side switch and/or through the first low side switch within a commutation cycle. Furthermore, the controller may be configured to determine whether the indication of the peak current is greater than or equal to a pre-determined peak current level, in order to determine a peak of the requested level of the electrical power at the output voltage. In other words, a peak current which is greater than or equal to the pre-determined peak current level may be an indication for the fact that there is a peak of the requested level of output current at the output of the power converter. A peak current which is equal to or greater than the pre-determined peak current level may be determined within a commutation cycle. Hence, load peaks may be determined rapidly and by consequence, the number of active inverter stages may be increased rapidly as well.

The controller may be configured to determine whether the indication of the peak current is greater than or equal to a pre-determined peak current level within a pre-determined number of consecutive commutation cycles, to determine a peak of the requested level of the electrical power at the output voltage. The observation of a plurality of consecutive commutation cycles (e.g. three cycles) may be beneficial, in order to avoid false peak detections, thereby increasing the stability of the power converter.

The controller may be configured to operate the power converter with more than the default number n of active inverter stages for a pre-determined time interval. Furthermore, the controller may be configured to operate the power converter with the default number n of active inverter stages, subsequent to the pre-determined time interval. By doing this, it is ensured that subsequent to the peak load, the number of active inverter stages is reduced again, thereby reducing the power dissipation of the power converter.

The controller may be configured to operate an active inverter stage of the power converter in a pulse width modulation (PWM) mode at a fixed commutation cycle rate and with a variable pulse width. The pulse width may define a duration of an on-state of the high side switch of the active inverter stage (and a duration of an off-state of the low side switch of the active inverter stage), or vice versa. The use of the PWM mode is beneficial, as the known commutation cycle (i.e. the known switching frequency of the power switches) may be removed or filtered out at the output of the power converter. Furthermore, the PWM mode typically leads to a reduced ripple voltage compared to the pulse frequency modulation (PFM) mode.

The controller may be configured to deactivate a particular inverter stage of the power converter by putting (and maintaining) the high side switch and the low side switch of the particular inverter stage concurrently in off-state. As a result of this, the switching losses of the particular inverter stage are reduced/removed.

According to a further aspect, a power converter configured to convert electrical power at an input voltage into electrical power at an output voltage is described. The power converter comprises any one or more of the features described in the present document. In particular, the power converter comprises a controller as described in the present document.

According to another aspect, a method for operating a controller and/or a power converter as outlined in the present document is described. The method may comprise steps which correspond to the features of the controller and/or power converter described in the present document. In particular, the method may comprise determining an indication of a requested level of the electrical power at the output voltage of the power converter. Furthermore, the method comprises activating or deactivating the second inverter stage based on the indication of the requested level of the electrical power at the output voltage.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1A:
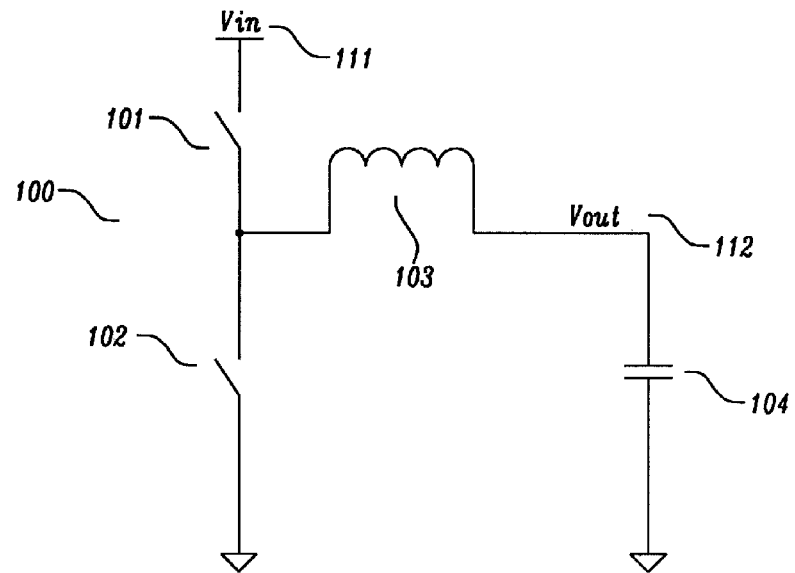
FIG. 1a shows a block diagram of an example buck converter.

As outlined above, the present document relates to configurable DC/DC power converters with increased power efficiency, notably with increased power efficiency at relatively low output current levels. FIG. 1a shows a block diagram of an example output stage 100 of a power converter. In the illustrated example, the output stage 100 comprises a buck converter. In particular, the output stage 100 of the illustrated DC/DC converter comprises an inverter with two power switches 101, 102. The two power switches 101, 102 (i.e. the inverter) form a half bridge comprising a high side switch 101 and a low side switch 102. The half bridge may be arranged between an input voltage 111 and ground. The power switches 101, 102 may be closed (on-state) and opened (off-state) in an alternating and mutually exclusive manner, in order to generate an alternating signal at a midpoint between the high side switch 101 and the low side switch 102. The inverter drives an inductor 103 which forms an LC circuit in conjunction with an output capacitor 104. The LC circuit filters the switching component of the alternating signal which is generated by the inverter. The voltage at a midpoint between the inductor 103 and the capacitor 104 corresponds to the output voltage 112 of the output stage 100.

Figure 1B:
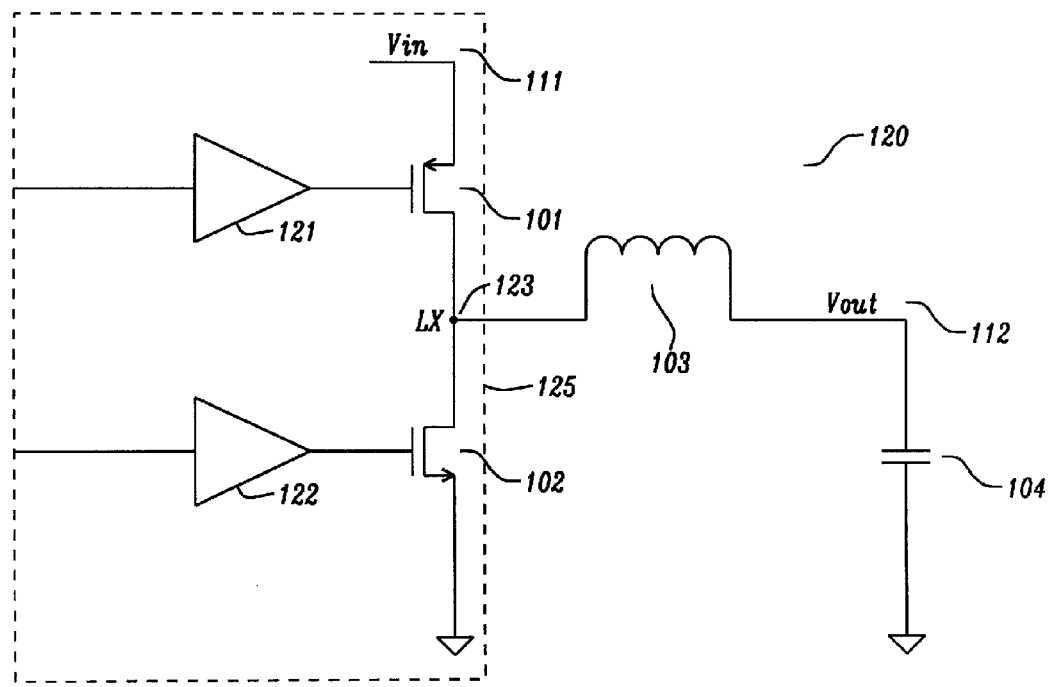
FIG. 1b shows a circuit diagram of an example buck converter using CMOS technology.

FIG. 1b shows an output stage 120 implemented in CMOS technology. In CMOS (Complementary Metal Oxide Semiconductor) technology the two power switches 101, 102 are implemented as MOS switches. In particular, the low side switch 102 may be implemented as an NMOS switch and the high side switch 101 may be implemented as a PINTOS switch. It should be noted that the high side switch 101 may also be implemented as an NMOS switch. Each power switch 101, 102 is driven by a respective driver 121, 122 which shape a gate voltage of the switches 101, 102, in order to provide an appropriate balance at the node "LX" 123 of the inverter, wherein the node 123 corresponds to the midpoint of the half bridge between the high side switch 101 and the low side switch 102. The driver 121 for the high side switch 101 may be referred to as the high side driver, and the driver 122 for the low side switch 102 may be referred to as the low side driver. The gate voltage which is generated by the high side driver 121 may be referred to as the drive signal for the high side switch 101, and the gate voltage which is generated by the low side driver 122 may be referred to as the drive signal for the low side switch 102.

Figure 2:
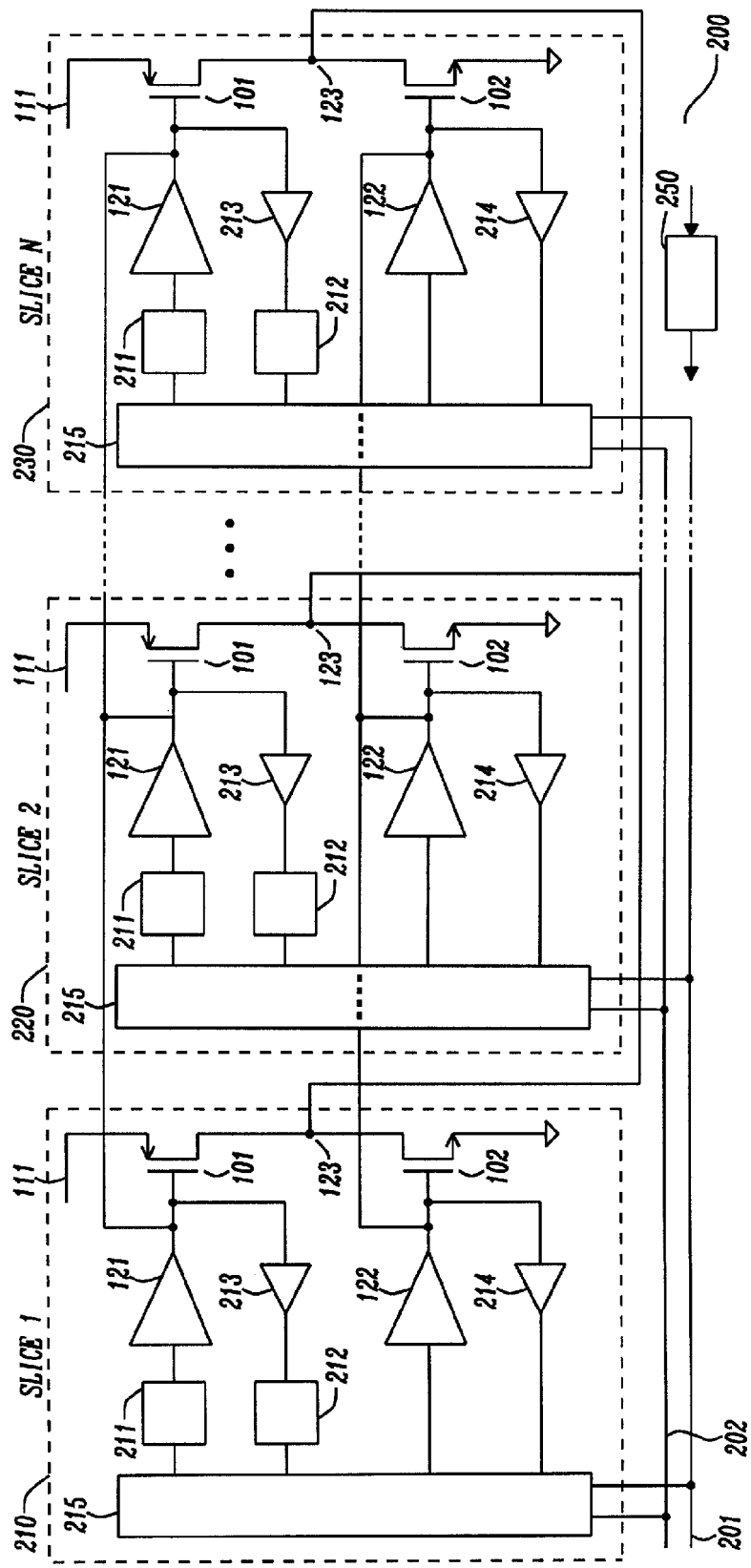
FIG. 2 shows a circuit diagram of an example power converter comprising a plurality of parallel inverter stages.

In a high voltage power converter the high side switch 101 (i.e. the high side pass transistor) may need to be driven with a gate voltage (i.e. a drive signal) which is related to the input voltage 111. Due to the use of relatively high input voltages 111 in the case of high voltage power converters, the logic drive signal may need to be up-shifted in order to drive the high side driver 121 at a voltage level which is sufficiently high relative to the input voltage 111. For this purpose, an inverter stage may comprise a level shifting unit 211 configured to shift the control signal for the high side driver 121 from a logic voltage level to a drive voltage level, wherein the logic voltage level is lower than the drive voltage level. This is illustrated in FIG. 2 which shows a block diagram of a power converter 200 comprising a plurality of inverter stages 210, 220, 230. It can be seen that the inverter stages 210, 220, 230 each comprise a level shifting unit 211 between a respective logic unit 215 and the respective high side driver 121*.

As outlined above, a power converter 200 may comprise a plurality of inverter stages 210, 220, 230 (also referred to as slices) which are arranged in parallel, in order to enable the power converter 200 to drive relatively large loads, i.e. to provide relatively high maximum output currents or maximum load currents. The use of different numbers of inverter stages 210, 220, 230 makes the power converter 200 modular and easily configurable for different load current requirements.

The power converter 200 of FIG. 2 comprises N parallel inverter stages 210, 220, 230, with N greater than 1. The inverter stages 210, 220, 230 may be designed in an equal manner. In particular, each inverter stage 210, 220, 230 may comprise a half bridge or inverter with a high side switch 101 and a low side switch 102, and with respective drivers 121, 122. The high side switch 101 and the low side switch 102 of an inverter are arranged in series between the input voltage 111 and ground. The midpoints 123 between the inverters of the different inverter stages 210, 220, 230 may be coupled with one another and with an inductor 103 (as illustrated in FIG. 1b).

Each inverter stage 210, 220, 230 may further comprise a level shifting unit 211 which is configured to shift the level of the control signal from a logic voltage level to a drive voltage level. The control signal (at the logic voltage level) may be generated by the logic unit 215 of an inverter stage 210, 220, 230. The control signal may be generated based on one or more controller signals 201, 202 from a controller (not shown) of the power converter 200. The one or more controller signals 201, 202 may comprise a pulse width modulated (pwm) and/or a pulse frequency modulated (pfm) signal. In particular, the one or more controller signals 201, 202 may comprise a controller signal 201 for enabling (i.e. closing) the high side switch 101 and/or a controller signal 202 for enabling (i.e. closing) the low side switch 102.

The logic unit 215 of an inverter stage 210, 220, 230 may be configured to generate the control signals for the high side switch 101 and for the low side switch 201. The control signal for the high side switch 101 may be referred to as the high side control signal and the control signal for the low side switch 102 may be referred to as the low side control signal.

The control signals may be generated such that a shoot-through of the respective inverter stage 210, 220, 230 is prevented. A shoot-through of an inverter stage 210, 220, 230 may occur if the high side switch 101 and the low side switch 102 of the inverter stage 210, 220, 230 are closed concurrently, thereby generating a short-circuit between the input voltage 111 and ground. Such a shoot-through may be avoided by ensuring that the high side switch 101 of the inverter stage 210, 220, 230 is triggered to be closed only once the low side switch 102 of the inverter stage 210, 220, 230 is open, and vice versa. For this purpose, the inverter stages 210, 220, 230 may comprise feedback units 213, 214 which are configured to provide a feedback to the logic unit 215 regarding the drive signals (i.e. the gate voltages) of the switches 101, 102, respectively. In particular, an inverter stage 210, 220, 230 may comprise a high side feedback unit 213 for providing a feedback (i.e. a high side feedback signal) regarding the drive signal of the high side switch 101 to the logic unit 215. The high side feedback signal may be level shifted from the drive voltage level to the logic voltage level using an inverse level shifting unit 212. Furthermore, an inverter stage 210, 220, 230 may comprise a low side feedback unit 214 for providing a feedback (i.e. a low side feedback signal) regarding the drive signal of the low side switch 101 to the logic unit 215. As the drive signal of the low side switch 101 is typically related to ground, no level shifting is required for the low side switch 101.

The drawback of using a plurality of parallel slices 210, 220, 230 is that each slice 210, 220, 230 contributes to the total power dissipation of the power converter 200 in a static and dynamic manner. A significant portion of the static power dissipation of a slice 210, 220, 230 may be due to the level shifting which is performed in each slice 210, 220, 230, in order to drive the high side switches 101 at the drive voltage level.

The dynamic contributions of the power dissipation may be given by the total amount of switching capacitances of the switches 101, 102 of the inverter stages 210, 220, 230. The power dissipation which is due to the switching of the power switches (e.g. due to the charging/discharging of the gate capacitances of the power switches 101, 102) of the inverter stages 210, 220, 230 is typically proportional to the switching frequency f, the value C of the gate capacitances and the square of the gate voltage V.

$$P_{cap} = f \cdot C \cdot V^2$$

A further contribution of the power dissipation may be given by the current that passes through the power switches 101, 102. This power dissipation is typically proportional to the square of the current I in an inverter stage 210, 220, 230 and the channel resistance R a power switch 101, 102.

$$P_{Rds\_on} = R_{ds} \cdot I^2$$

For low levels of load current of the power converter 200, the efficiency of the output stage comprising a plurality of inverter stages 210, 202, 203 decreases, mainly due to the contribution of the capacitance dissipation $P_{cap}$.

The present document addresses the above mentioned technical problem. In particular, the present document describes a power converter 200 comprising a plurality of parallel inverter stages 210, 220, 230, which exhibits increased power efficiency, even at relatively low levels of output current.

As indicated above, the power converter 200 of FIG. 2 comprises a plurality of parallel inverter stages 210, 220, 230 for providing sufficient current in case of high loads. On the other hand, for low levels of output current, a single slice 210, 220, 230 (or a reduced number of slices 210, 220, 230) may be sufficient to supply the required power to the load. However, since all the slices 210, 220, 230 are typically connected together, all the slices 210, 220, 230 contribute in the same manner to the power dissipation, thereby reducing the overall efficiency of the DC/DC converter. For relatively low levels of output current, the output power $P_{out}$ decreases, while the overall power loss $P_{loss}$ remains substantially the same. As a result of this, the overall efficiency $\eta = P_{out}/(P_{out} + P_{loss})$ of the power converter 200 drops.

In the present document, it is proposed to adapt the number of parallel inverter stages 210, 220, 230, which is actually used for providing the output current, in dependence of the currently requested output current. In particular, all the slices 210, 220, 230 of the power converter 200 may be used concurrently to provide relatively large output currents and just a single slice 210 (or a reduced number of slices 210) may be used in the case of relatively small output currents. When only a single slice 210 (or a reduced number of slices 210) is enabled, all the other slices 220, 230 of the power converter 200 are disabled (e.g. by maintaining the respective high side switches 101 and low side switches 102 open). By doing this, there is no contribution of the disabled slices 220, 230 to the capacitive switching losses. Hence, the power dissipation $P_{loss}$ of the power converter 200 drops as the output power $P_{out}$ of the power converter 200 drops. As a result of this, the power efficiency of the power converter 200 remains high, even for relatively low levels of output currents.

FIG. 2 shows a coupling between the gates of the high side switches 101 and the gates of the low side switches 102 of the different inverter stages 210, 220, 230, respectively. That is, an output of the first high side driver may be coupled with an output of the second high side driver. In a similar manner, an output of the first low side driver may be coupled with an output of the second low side driver. This may be beneficial for providing a balance between the first and second drive signals for the first and second high side switches/for the first and second low side switches, respectively. In particular, this may ensure a concurrent transition from on-state to off-state and vice versa of the plurality of parallel high side switches.

The coupling of the outputs of the high side drivers and/or the output of the low side drivers is optional. In particular, in case of a deactivated second inverter stage 220, the gate of the second high side switch 101 and the gate of the second low side switch 102 are typically decoupled from the gates of the high side switches 101 and low side switches 102 of the activated inverter stages 210, in order to allow for a deactivation of the second inverter stage 220.

The dynamic slice configuration allows improving efficiency at relatively low current load levels. This is due to the fact that at low levels of output current the dominant source of power dissipation is typically given by the switching of power switches 101, 102 of the inverter stages 210, 220, 230. The contribution to the power dissipation which is given by the channel resistors $R_{ds}$ is typically relatively small, because of the relatively low current level at the load.

Another possibility for improving the efficiency of the power converter 200 at relatively low levels of output current could be the use of a PFM (pulse frequency modulation) mode for controlling the inverter stages 210, 220, 230. However, a drawback of the PFM mode is the variable switching frequency. As a result of this, the switching frequency of the inverter stages 210, 220, 230 is not known. Using the PWM (pulse width modulation) mode for controlling the inverter stages 210, 220, 230 may be preferable, because the switching frequency is known, and may be filtered at the output. Moreover the ripple voltage is typically lower when using the PWM mode compared to the PFM mode. Hence, the dynamic activation/deactivation of inverter stages 210, 220, 230 may be used in conjunction with the PWM mode, thereby enabling a reliable removal of the switching/commutation frequency and thereby providing a reduced ripple at the output of the power converter 200.

Figure 5:
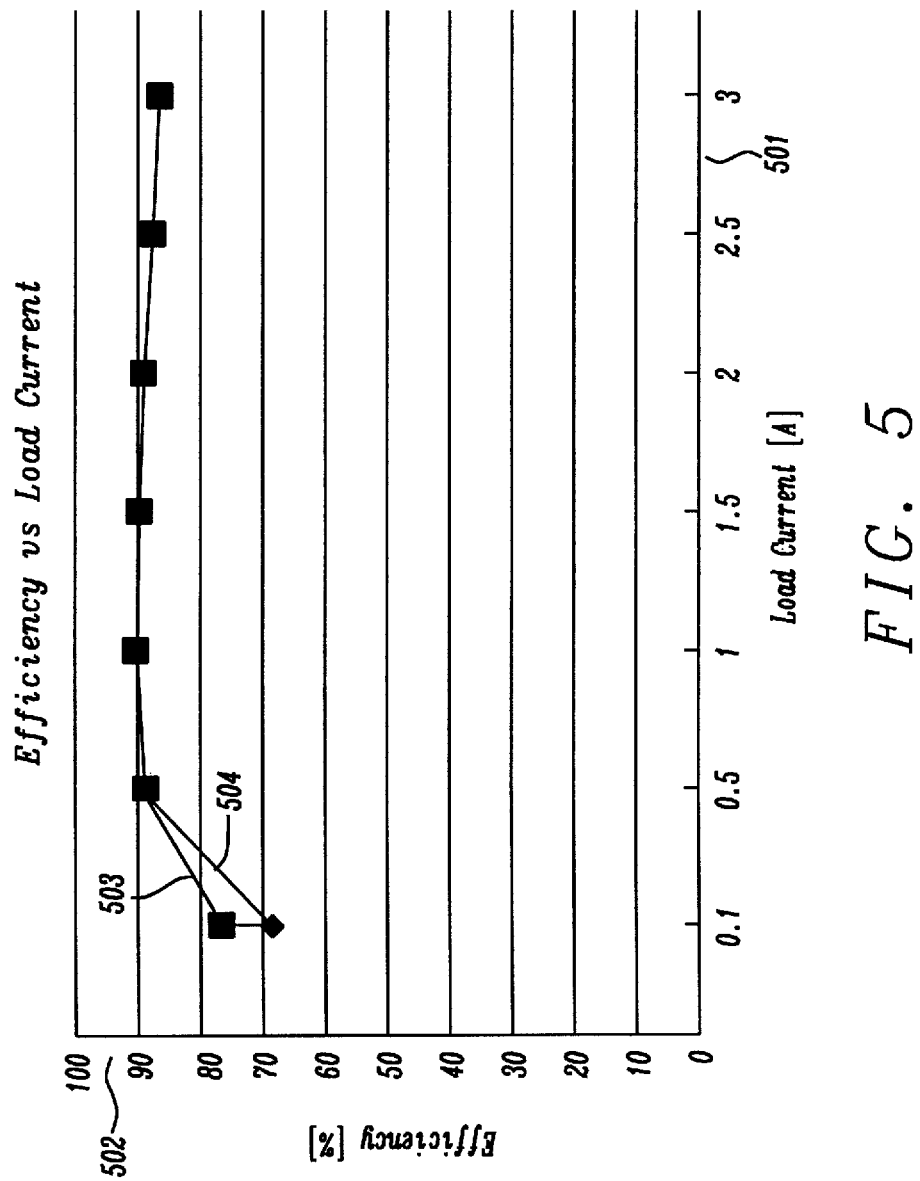
FIG. 5 illustrates the power efficiency of an example power converter comprising a variable number of active inverter stages.

FIG. 5 illustrates example efficiency improvements which may be achieved when using the dynamic activation/deactivation of inverter stages 210, 220, 230. FIG. 5 shows the power efficiency 502 η as a function of the output current 501. In particular, FIG. 5 shows the power efficiency curve 503, when using the dynamic activation/deactivation of inverter stages 210, 220, 230 compared to the power efficiency curve 504, when using a static power converter 200 comprising a plurality of inverter stages 210, 220, 230. The power converter 200 is designed to operate at a typical output current 501 of 1.5 A. It can be seen that between 100 mA to 500 mA, the reduction of the number of activated slices 210, 220, 230 allows increasing the power efficiency 502 to almost 80% compared to the static case which provides only a power efficiency 502 of less than 70%. The power efficiency curve 503 illustrates the efficiency of a power converter 200 which is configured to switch from a configuration with only a single activated slice 210 to a configuration with all slices 210, 220, 230 being enabled. The power efficiency curve 504 represents the efficiency of a power converter 200 with all slices 210, 220, 230 being connected together and being activated. For output currents 501 larger than 500 mA, the two curves 503, 504 match, because the two power converters 200 have the same number of active slices 210, 220, 230.

FIG. 2 illustrates a controller 250 of the power converter 200. The controller 250 is configured to adapt the number of active inverter stages 210, 220, 230 of the power converter 200 in order to reduce the power dissipation in case of relatively low output currents. In particular, the controller 250 may be configured to determine an indication of the output current which is requested at the output of the power converter 200. Furthermore, the controller 250 may be configured to activate a number of inverter stages 210, 220, 230 based on the indication of the output current. The number of inverter stages 210, 220, 230 should be sufficient to provide the requested output current. The other inverter stages 210, 220, 230 may be deactivated, thereby increasing the power efficiency of the power converter 200.

Hence, the controller 250 may be configured to switch between different sets of active inverter stages 210, 220, 230. For this purpose, the controller 250 may be driven by or may receive information from a microcontroller and/or may be driven by a loop that evaluates the average current inside the coil 103 of the power converter 200.

The microcontroller of an electronic device (e.g. a smartphone or a computing device) which comprises the power converter 200 typically is aware of the one or more components of the electronic devices which are active. Examples of such components are a display, different telecommunication interfaces such as GSM, UMTS, LTE, WLAN, localisation sensors such as GPS, different applications such as a telephone application or a gaming application. The load current which is required by the different components of the electronic device typically depends on the set of active components. Hence, the knowledge regarding the active components of the electronic device provides an indication of the output current which is to be provided by the power converter 200. By way of example, the controller 250 may have access to a look-up table (LUT) which provides a mapping between the active components of the electronic devices and associated load currents. In this manner, the controller 250 may determine the total output current based on the knowledge of the active components of the electronic device. The controller 250 may then activate a sufficient number of inverter stages 210, 220, 230 for providing sufficient output current to the active components of the electronic device.

Furthermore, the controller 250 may be configured to react to peak current requirements (e.g. upon activation of a further component of the electronic device, and/or upon transmission of a burst of data). This may be achieved using a relatively fast adaption loop which may be used to activate one or more additional slices 210, 220, 230 in order to meet peak current requirements of the electronic device. This fast adaption mechanism may be more reactive than an adaption loop based on the average output current (or coil current) of the power converter 200.

Overall, the controller 250 may be configured to determine a default number of active slices 210, 220, 230 using an indication of a default output current. The indication of the default output current may be provided by a microcontroller of an electronic device (as indicated above) and/or by an average output current within the inductor 103 of the power converter 200. Furthermore, the controller 250 may be configured to adapt the default number of active slices 210, 220, 230 using a relatively fast adaption loop, in order to react to peak output currents.

As indicated above, the default number of slices may be determined based on the knowledge of the microprocessor of an electronic device. The microprocessor of the electronic device typically knows the active applications and their power requirements. The controller 250 may be configured to set the default number of active slices 210, 220, 230 accordingly. Alternatively or in addition, the controller 250 may be configured to determine the average output current within the inductor 103 of the power converter 200. For this purpose, the inverter stages 210, 220, 230 may comprise current sensing means (e.g. sensing resistors) for measuring the current through the power switches 101, 102. The average output current of the power converter 200 may be given as the average current through the power switches 101, 102 within a commutation cycle of the inverter stages 210, 220, 230. The default number of active slices 210, 220, 230 may be selected in dependence of the average output current.

As indicated above, the inverter stages 210, 220, 230 may comprise current sensing means which are configured to determine an indication of the current through the high side switch 101 and/or through the low side switch 102. Hence, the controller 250 may be configured to determine the current through the high side switch 101 and/or through the low side switch 102. In particular, the controller 250 may be configured to determine the peak current through the high side switch 101 and/or through the load side switch 102. If the peak current reaches or exceeds a pre-determined peak current limit, this may be an indication for the fact that the power converter 200 needs to provide a peak load current at its output.

If the peak current limit is reached a pre-determined number of consecutive times (for example 3 times) one or more additional slices 230 may be enabled or activated in order to support the peak load request. In other words, the fact that the peak current within one or more active inverter stages 210, 220 reaches or exceeds the pre-determined peak current limit for a pre-determined number of consecutive times is an indication for the fact that the power converter 200 has to provide a peak output current. As a result of this, at least one additional slice 230 may be activated, in order to provide the additional output current. The peak currents of the one or more active slices 210, 220 provide an approximation of the output current. Hence, the controller 205 may detect a time instant, when a certain value of the coil's current is reached and flag a warning (peak current detection).

The controller 250 may be configured to maintain the power converter 200 in a configuration comprising an increased number of slices 210, 220, 230 for a pre-determined time interval. Subsequently, the controller 250 may deactivate the additional one or more slices 230, in order to operate the power converter 200 using the default number of active slices 210, 220.

As such, the controller 250 may be configured to react rapidly to peak output currents. The above mentioned adaption scheme may be referred to as the fast adaption loop.

In the case of a constantly increased or reduced load, the controller 250 may be configured to increase or reduce the default number of active slices 210, 220 as outlined above. If the maximum current is known by the application (e.g. by the microprocessor of the electronic device) then this knowledge may be used to adapt the default number of active slices 210, 220 accordingly. Alternatively or in addition, if the averaging output current measurement indicates that the level of the average output current has changed, then the default number of slices may be adapted to the new requested level of the output current.

Figure 3A:
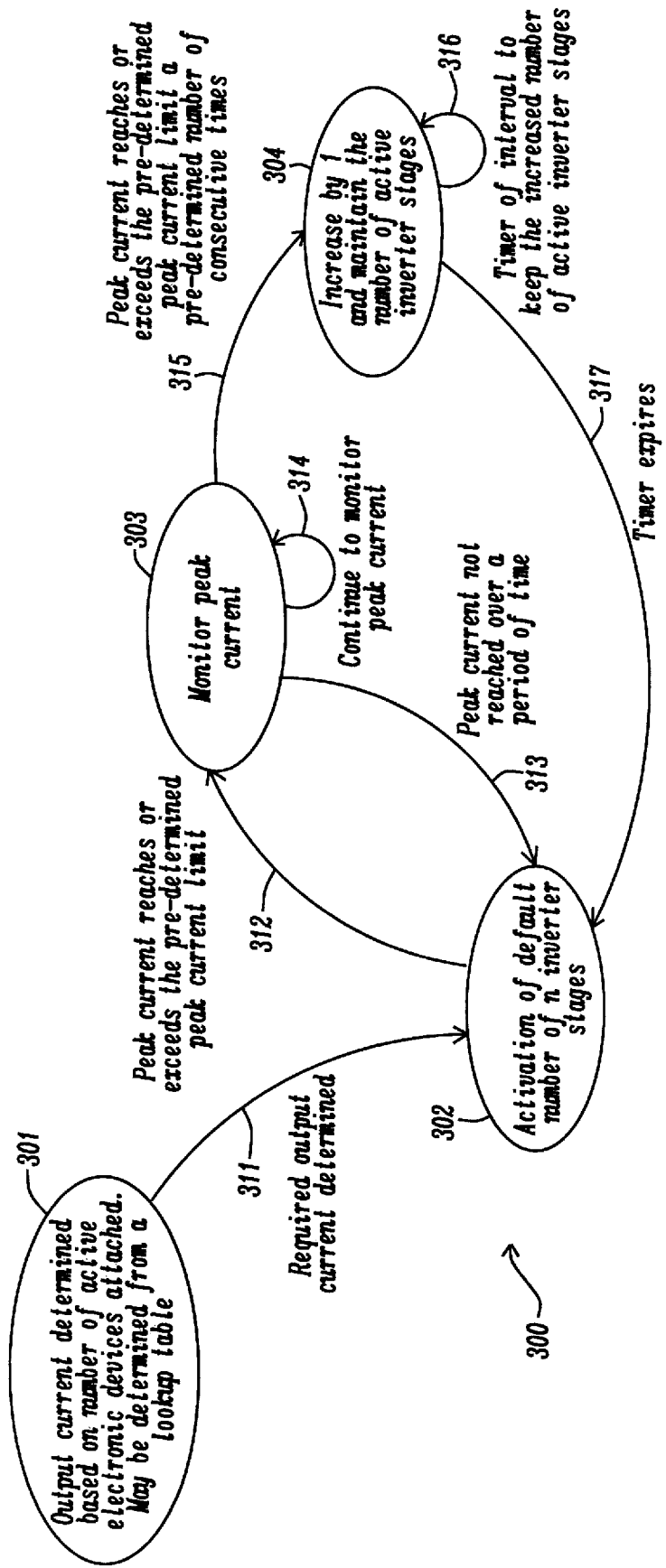
FIG. 3a shows a finite state diagram of an example state machine for controlling the number of active parallel inverter stages.
Figure 3B:
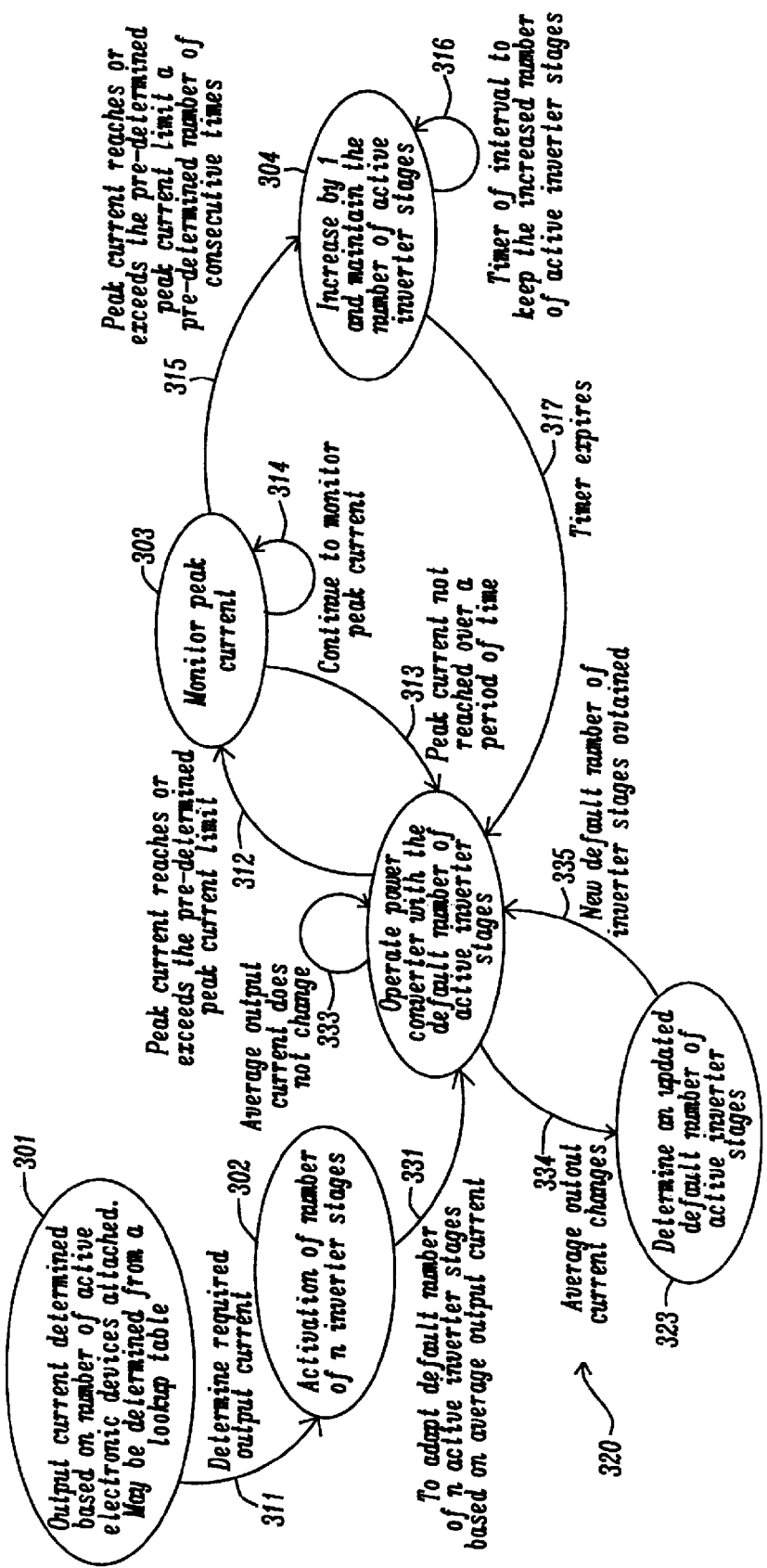
FIG. 3b shows a finite state diagram of another example state machine for controlling the number of active parallel inverter stages.

The above mentioned schemes for determining the default number of active inverter stages 210, 220 and/or the scheme for adapting the number of active inverter stages 210, 220 subject to peak output currents may be implemented as finite state machines. In other words, the controller 250 may be configured to control the power converter 200, i.e. the inverter stages 210, 220, 230 of the power converter 200, using a finite state machine. FIGS. 3a and 3b show example state machines 300, 320 for the case that the default number of active inverter stages 210, 220 is determined based on the knowledge of the microcontroller of the electronic device and/or based on the average output current.

The state machine 300 of FIG. 3a comprises the states 301 and 302 which relate to the determination of the default number n of active slices 210, 220 for the power converter 200, wherein n=1, . . . , N, with N being the total number of slices 210, 220, 230 of the power converter 200. In state 301, an indication of the output current is determined based on the number of active components of the electronic device, i.e. based on the application which is to be supported by the power converter 200. As indicated above, the indication of the required level of output current may be determined using a LUT. The indication of the required level of output current leads to the activation of a default number n of inverter stages 210, 220 (transition 311 to state 302). Hence, the power converter 200 is operated with the default number n of active inverter stages 210, 220 (state 302). All other inverter stages 230 of the power converter 200 may be inactive.

The states 303, 304 and the transitions 312, 313, 314, 315, 316, 317 may be used to implement the fast adaption loop for reacting to peak output currents. As indicated above, the controller 250 may be configured to verify whether the peak current in one or more active inverter stages 210, 220 reaches or exceeds the pre-determined peak current limit. If this is the case, the state machine 300 transitions 312 to state 303. In state 303, the controller 250 continues 314 to verify the peak current. If the peak current reaches or exceeds the pre-determined peak current limit a pre-determined number of consecutive times, the state machine 300 transitions 315 to state 304. Otherwise, the state machine 300 returns 313 to state 302.

In state 304 the number of active inverter stages 210, 220 is increased (e.g. to n+1 active inverter stages). Furthermore, a timer 316 is activated. The state machine 300 stays in state 304 for the pre-determined time interval which is set by the timer 316. Subsequently, the state machine 300 returns 317 to state 302, where the power converter 200 is operated with the default number n of active inverter stages 210, 220, 230.

As indicated above, the default number n of active inverter stages 210, 220 may be modified, if it is determined in state 301 that the indication of the required level of output current has been increased or reduced, e.g. due to a modified number of active components of the electronic device.

The state machine 320 of FIG. 3b comprises the same fast adaption loop as the state machine 300 of FIG. 3a. However, the state machine 320 makes use of the average output current of the power converter 200, in order to determine and/or to adapt the default number n of active inverter stages 210, 220. Furthermore, the state machine 320 comprises the optional states 301, 302 and the optional transition 311 for determining the default number n of active inverter stages 210, 220 based on the knowledge of the active number of components of the electronic device.

In order to adapt the default number n of active inverter stages 210, 220 based on the average output current, the state machine 320 transitions 331 from state 302 to state 322 where the controller 250 monitors the average output current and operates the power converter 200 using the default number n of active inverter stages 210, 220. If the average output current does not change, the state machine 320 remains 333 within state 322. However, if the average output current changes 334, the state machine 320 transitions 334 to state 323, in order to determine an updated default number of active inverter stages 210, 220. For this purpose, a look-up table may be used which maps the determined average output current to a respective default number of active inverter stages 210, 220. Then the state machine 320 returns 335 to state 322, in order to operate the power converter 200 with the updated default number of active inverter stages 210, 220.

In the finite state machine 320 it may be assumed that the loop for updating the default number of active inverter stages is slower than the adaption loop for handling peak output currents. If this is not the case, the loop for updating the default number of active inverter stages may also be used for adapting the number of active slices for the provision of peak output currents.

Figure 4:
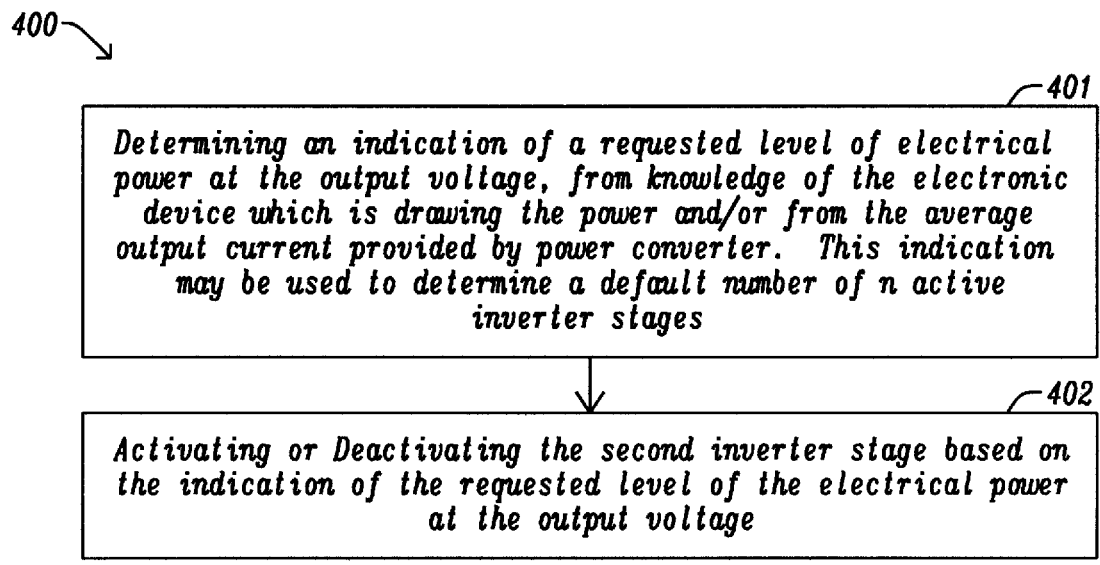
FIG. 4 shows a flow chart of an example method for controlling a power converter comprising a plurality of parallel inverter stages.

FIG. 4 shows a flow chart of an example method 400 for operating a power converter 200. The power converter 200 is configured to convert electrical power at an input voltage 111 into electrical power at an output voltage 112. The power converter 200 comprises a first inverter stage 210 comprising a first high side switch 101 and a first low side switch 102 which are arranged in series between the input voltage 111 and a reference voltage (e.g. ground). The power converter 200 further comprises a second inverter stage 220 comprising a second high side switch 101 and a second low side switch 102 which are arranged in series between the input voltage 111 and the reference voltage. The midpoint 123 between the first high side switch 101 and the first low side switch 102 is coupled with the midpoint 123 between the second high side switch 101 and the second low side switch 102. The electrical power at the output voltage 112 is drawn from the midpoint.

The method 400 comprises determining 401 an indication of a requested level of the electrical power at the output voltage 112 (or a requested level of the output current at the output of the power converter 200). This indication may be determined e.g. based on the knowledge of the microcontroller of the electronic device which is drawing the electrical power at the output of the power converter 200, and/or based on an average output current provided by the power converter 200. As outlined above, this indication may be used to determine a default number n of active inverter stages 210, 220. As such, the method 400 may comprise the further step of activating or deactivating 402 the second inverter stage 220 based on the indication of the requested level of the electrical power at the output voltage 112.

In the present document, a new architecture for a power converter comprising a plurality the inverter stages has been described. The power converter is enabled to reduce the number of active inverter stages in order to limit the power dissipation in case of reduced load and to thereby improve efficiency. Furthermore, an auto-switching mechanism for determining the number of active inverter stages has been described. The described mechanism allows a fast adaption to peak output currents by adapting the number of active inverter stages in accordance to the requested output current.

Using the new architecture for the inverter stages of a DC/DC converter, the efficiency may be improved at low current levels and the power consumption may be reduced. The efficiency improvement is made possible without using PFM techniques that employ different switching frequencies. This is beneficial at application level because when using PWM controlled DC/DC converters, the switching frequency is known and may therefore be filtered out. Furthermore, the use of PWM allows for less ripple voltage compared to PFM techniques.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A controller for controlling a power converter which is configured to convert electrical power at an input voltage into electrical power at an output voltage, wherein the power converter comprises a first inverter stage comprising a first high side switch and a first low side switch which are arranged in series between the input voltage and a reference voltage; wherein the power converter further comprises a second inverter stage comprising a second high side switch and a second low side switch which are arranged in series between the input voltage and the reference voltage; wherein a midpoint between the first high side switch and the first low side switch is coupled with a midpoint between the second high side switch and the second low side switch; and wherein the electrical power at the output voltage is drawn from the midpoint; wherein the power converter comprises a pre-determined number N of inverter stages, N>1; wherein the controller is configured to
   determine an indication of a requested level of the electrical power at the output voltage, and
   activate or deactivate the second inverter stage based on the indication of the requested level of the electrical power at the output voltage;
   determine a default number n of active inverter stages based on the indication of the requested level of the electrical power at the output voltage, with 0<n<N;
   operate the power converter with the default number n of active inverter stages wherein the default number n of active inverter stages comprises the first inverter stage;
   determine a peak of the requested level of the electrical power at the output voltage; and
   operate the power converter with more than the default number n of active inverter stages, subject to determining a peak of the requested level of the electrical power at the output voltage.

2. The controller of claim 1, wherein
   the power converter is configured to provide the electrical power at the output voltage to an electronic device comprising a plurality of components;
   the controller is configured to
      determine which one or more of the plurality of components are active; and
      determine the indication of the requested level of the electrical power, based on the one or more active components.

3. The controller of claim 2, wherein the controller is configured to access a look-up table providing a mapping between the plurality of components of the electronic device and respective levels of electrical power.

4. The controller of claim 1, wherein the controller is configured to
   determine an indication of a current through the first high side switch and/or through the first low side switch; and
   determine the indication of the requested level of the electrical power at the output voltage based on the indication of the current through the first high side switch and/or through the first low side switch.

5. The controller of claim 1, wherein the controller is configured to
   determine an indication of an average current through the first high side switch and/or through the first low side switch within a commutation cycle; and
   determine the indication of the requested level of the electrical power at the output voltage based on the indication of the average current through the first high side switch and/or through the first low side switch.

6. The controller of claim 1, wherein the controller is configured to
   determine an indication of a peak current through the first high side switch and/or through the first low side switch; and
   determine whether the indication of the peak current is greater than or equal to a pre-determined peak current level, to determine a peak of the requested level of the electrical power at the output voltage.

7. The controller of claim 6, wherein the controller is configured to determine whether the indication of the peak current is greater than or equal to a pre-determined peak current level within a pre-determined number of consecutive commutation cycles, to determine a peak of the requested level of the electrical power at the output voltage.

8. The controller of claim 1, wherein the controller is configured to
   operate the power converter with more than the default number n of active inverter stages for a pre-determined time interval; and
   operate the power converter with the default number n of active inverter stages, subsequent to the pre-determined time interval.

9. The controller of claim 1, wherein
   the controller is configured to operate an active inverter stage of the power converter in a pulse width modulation mode at a fixed commutation cycle rate and with a variable pulse width; and
   the pulse width defines a duration of an on-state of the high side switch of the active inverter stage.

10. The controller of claim 1, wherein the controller is configured to deactivate a particular inverter stage of the power converter by putting the high side switch and the low side switch of the particular inverter stage concurrently in off-state.

11. A power converter configured to convert electrical power at an input voltage into electrical power at an output voltage, wherein the power converter comprises a
   pre-determined number N of inverter stages, with N>1, including
      a first inverter stage comprising a first high side switch and a first low side switch which are arranged in series between the input voltage and a reference voltage; and
      a second inverter stage comprising a second high side switch and a second low side switch which are arranged in series between the input voltage and the reference voltage; wherein a midpoint between the first high side switch and the first low side switch is coupled with a midpoint between the second high side switch and the second low side switch; and wherein the electrical power at the output voltage is drawn from the midpoint; and
      wherein the power converter further comprises a controller which is configured to
         determine an indication of a requested level of the electrical power at the output voltage;

activate or deactivate the second inverter stage based on the indication of the requested level of the electrical power at the output voltage;

determine a default number n of active inverter stages based on the indication of the requested level of the electrical power at the output voltage, with 0<n<N;

operate the power converter with the default number n of active inverter stages; wherein the default number n of active inverter stages comprises the first inverter stage;

determine a peak of the requested level of the electrical power at the output voltage; and operate the power converter with more than the default number n of active inverter stages, subject to determining a peak of the requested level of the electrical power at the output voltage.

12. The power converter of claim 11, further comprising a filter unit coupled to the midpoint for providing the electrical power at the output voltage.

13. The power converter of claim 11, wherein
a high side switch comprises a p-type metal oxide semiconductor transistor; and/or
a low side switch comprises an n-type metal oxide semiconductor transistor.

14. A method for operating a power converter which is configured to convert electrical power at an input voltage into electrical power at an output voltage, wherein the power converter comprises a first inverter stage comprising a first high side switch and a first low side switch which are arranged in series between the input voltage and a reference voltage; wherein the power converter further comprises a second inverter stage comprising a second high side switch and a second low side switch which are arranged in series between the input voltage and the reference voltage; wherein a midpoint between the first high side switch and the first low side switch is coupled with a midpoint between the second high side switch and the second low side switch; and wherein the electrical power at the output voltage is drawn from the midpoint; wherein the power converter comprises a pre-determined number N of inverter stages, with N>1; wherein the method comprises determining an indication of a requested level of the electrical power at the output voltage;

activating or deactivating the second inverter stage based on the indication of the requested level of the electrical power at the output voltage;

determining a default number n of active inverter stages based on the indication of the requested level of the electrical power at the output voltage, with 0<n<N;

operating the power converter with the default number n of active inverter stages; wherein the default number n of active inverter stages comprises the inverter stage;

determining a peak of the requested level of the electrical power at the output voltage; and operating the power converter with more than the default number n of active inverter stages, subject to determining a peak of the requested level of the electrical power at the output voltage.

15. A method of providing a controller for controlling a power converter which converts electrical power at an input voltage into electrical power at an output voltage, wherein the power converter comprises a first inverter stage comprising a first high side switch and a first low side switch which are arranged in series between the input voltage and a reference voltage; wherein the power converter further comprises a second inverter stage comprising a second high side switch and a second low side switch which are arranged in series between the input voltage and the reference voltage; wherein a midpoint between the first high side switch and the first low side switch is coupled with a midpoint between the second high side switch and the second low side switch; and wherein the electrical power at the output voltage is drawn from the midpoint; wherein the power converter comprises a pre-determined number N of inverter stages, with N>1; comprising the steps of:

determining an indication of a requested level of the electrical power at the output voltage, and activating or deactivating the second inverter stage based on the indication of the requested level of the electrical power at the output voltage;

determining a default number n of active integer stages based on the indication of the requested level of the electrical power at the output voltage, with 0<n<N;

operating the power converter with the default number n of active inverter stages; wherein the default number n of active inverter stages comprises the first inverter stage;

determining a peak of the requested level of the electrical power at the output voltage; and operating the power converter with more than the default number n of active inverter stages, subject to determining a peak of the requested level of the electrical power at the output voltage.

16. The method of providing a controller of claim 15, wherein
the power converter provides the electrical power at the output voltage to an electronic device comprising a plurality of components;
the controller
determines which one or more of the plurality of components are active; and
determines the indication of the requested level of the electrical power, based on the one or more active components.

17. The method of providing a controller of claim 16, wherein the controller accesses a look-up table providing a mapping between the plurality of components of the electronic device and respective levels of electrical power.

18. The method of providing a controller of claim 15, wherein the controller
determines an indication of a current through the first high side switch and/or through the first low side switch; and
determines the indication of the requested level of the electrical power at the output voltage based on the indication of the current through the first high side switch and/or through the first low side switch.

19. The method of providing a controller of claim 15, wherein the controller
determines an indication of an average current through the first high side switch and/or through the first low side switch within a commutation cycle; and
determines the indication of the requested level of the electrical power at the output voltage based on the indication of the average current through the first high side switch and/or through the first low side switch.

20. The method of providing a controller of claim 15, wherein the controller
determines an indication of a peak current through the first high side switch and/or through the first low side switch; and
determines whether the indication of the peak current is greater than or equal to a pre-determined peak current level, to determine a peak of the requested level of the electrical power at the output voltage.

21. The method of providing a controller of claim 20, wherein the controller determines whether the indication of the peak current is greater than or equal to a pre-determined peak current level within a pre-determined number of consecutive commutation cycles, to determine a peak of the requested level of the electrical power at the output voltage.

22. The method of providing a controller of claim 15, wherein the controller
   operates the power converter with more than the default number n of active inverter stages for a pre-determined time interval; and
   operates the power converter with the default number n of active inverter stages, subsequent to the pre-determined time interval.

23. The method of providing a controller of claim 15, wherein
   the controller operates an active inverter stage of the power converter in a pulse width modulation mode at a fixed commutation cycle rate and with a variable pulse width; and
   the pulse width defines a duration of an on-state of the high side switch of the active inverter stage.

24. The method of providing a controller of claim 15, wherein the controller deactivates a particular inverter stage of the power converter by putting the high side switch and the low side switch of the particular inverter stage concurrently in off-state.

\* \* \* \* \*